US006879492B2

(12) United States Patent
Alcoe et al.

(10) Patent No.: US 6,879,492 B2
(45) Date of Patent: Apr. 12, 2005

(54) HYPERBGA BUILDUP LAMINATE

(75) Inventors: David J. Alcoe, Vestal, NY (US); Kim J. Blackwell, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 09/819,457

(22) Filed: Mar. 28, 2001

(65) Prior Publication Data

US 2002/0139578 A1 Oct. 3, 2002

(51) Int. Cl.[7] .............................. H05K 7/10; H05K 1/00; H05K 1/11; H05K 1/03; H01R 9/00
(52) U.S. Cl. .................. 361/748; 361/750; 361/767; 361/771; 361/774; 361/792; 174/250; 174/255; 174/261; 174/262; 174/264
(58) Field of Search ................. 361/748, 750, 361/767, 771, 774, 792, 795, 777, 736, 794, 793; 174/250, 255, 261, 262, 264; 257/774, 691

(56) References Cited

U.S. PATENT DOCUMENTS

| | | | | |
|---|---|---|---|---|
| 5,142,775 A | * | 9/1992 | Wiley ........................... 29/852 |
| 5,250,843 A | * | 10/1993 | Eichelberger ................ 257/692 |
| 5,316,803 A | | 5/1994 | White, Jr. et al. ........... 427/554 |
| 5,418,689 A | * | 5/1995 | Alpaugh et al. ............. 174/250 |
| 5,435,057 A | * | 7/1995 | Bindra et al. ................. 29/830 |
| 5,491,301 A | * | 2/1996 | Akiba et al. ................ 174/250 |
| 5,536,579 A | | 7/1996 | Davis et al. ................ 428/421 |
| 5,560,840 A | | 10/1996 | Covert et al. ............... 216/108 |
| 5,626,771 A | | 5/1997 | Davis et al. ................... 216/13 |
| 5,672,548 A | | 9/1997 | Culnane et al. ............. 437/209 |
| 5,723,062 A | | 3/1998 | Covert et al. .............. 252/79.2 |
| 5,726,863 A | | 3/1998 | Nakayama et al. ......... 361/794 |
| 5,798,563 A | | 8/1998 | Feilchenfeld et al. ....... 257/668 |
| 5,847,935 A | | 12/1998 | Thaler et al. ............... 361/761 |
| 5,863,406 A | * | 1/1999 | Mazzoni et al. ............ 205/126 |
| 5,877,550 A | | 3/1999 | Suzuki ....................... 257/700 |
| 5,886,406 A | | 3/1999 | Bhansali ..................... 257/698 |
| 5,926,377 A | | 7/1999 | Nakao et al. ............... 361/763 |
| 5,989,443 A | | 11/1999 | Covert et al. ................ 216/13 |
| 6,006,428 A | | 12/1999 | Feilchenfeld et al. ......... 29/852 |
| 6,054,758 A | | 4/2000 | Lamson ...................... 257/691 |
| 6,090,633 A | | 7/2000 | Yu et al. ...................... 438/15 |
| 6,169,329 B1 | * | 1/2001 | Farnworth et al. .......... 257/693 |
| 6,178,093 B1 | * | 1/2001 | Bhatt et al. ................. 174/255 |

(Continued)

FOREIGN PATENT DOCUMENTS

JP      1-280328      * 11/1989
JP      7-192105      *  7/1995

OTHER PUBLICATIONS

Multilayer Substrate With Low Coefficient of Thermal Expansion, Nakamura et al., 2000 International Symposium on Microelect, pp. 235–240.

Primary Examiner—Carl Whitehead, Jr.
Assistant Examiner—James M. Mitchell
(74) Attorney, Agent, or Firm—Schmeiser, Olsen & Watts; William H. Steinberg

(57) ABSTRACT

A method and structure for forming an electronic structure that comprises a redistribution structure on a circuitized substrate. The redistribution structure includes N dielectric layers (N $\geq 2$) and N metal planes formed in the following sequence: dielectric layer 1 on a metallic plane that exists on a surface of the substrate, metal plane 1 on dielectric layer 1, dielectric layer 2 on dielectric layer 1 and metal plane 1, metal plane 2 on the dielectric layer 2, ..., dielectric layer N on dielectric layer N-1 and metal plane N-1, and metal plane N on the dielectric layer N. Metal planes or metallic planes may include signal planes, power planes, ground planes, etc. A microvia structure, which is formed through the N dielectric layers and electrically couples metal plane N to the metallic plane, includes a microvia or a portion of a microvia through each dielectric layer.

35 Claims, 3 Drawing Sheets

U.S. PATENT DOCUMENTS

| | | | | |
|---|---|---|---|---|
| 6,203,967 | B1 | * | 3/2001 | Westbrook et al. .......... 430/313 |
| 6,262,579 | B1 | * | 7/2001 | Chazan et al. .............. 324/537 |
| 6,294,744 | B1 | * | 9/2001 | Kinoshita .................... 174/262 |
| 6,340,841 | B2 | * | 1/2002 | Iijima et al. ................ 257/678 |
| 6,373,717 | B1 | * | 4/2002 | Downes et al. ............. 361/795 |
| 6,376,769 | B1 | * | 4/2002 | Chung ....................... 174/52.2 |
| 6,384,344 | B1 | * | 5/2002 | Asai et al. .................. 174/261 |
| 6,388,208 | B1 | * | 5/2002 | Kiani et al. ................. 174/266 |
| RE37,840 | E | * | 9/2002 | Bhatt et al. .................... 29/852 |
| 6,497,943 | B1 | * | 12/2002 | Jimarez et al. ............. 428/209 |
| 6,528,179 | B1 | * | 3/2003 | Jimarez et al. ............. 428/620 |
| 2001/0035570 | A | * | 1/2000 | Iijima et al. ................ 257/678 |
| 2002/0043399 | A | * | 12/2000 | Sasaki et al. ............... 174/260 |
| 2001/0008309 | A1 | * | 7/2001 | Iijima et al. ................ 257/737 |
| 2001/0039300 | A1 | * | 11/2001 | Suzuki et al. .................. 522/31 |
| 2002/0145203 | A1 | * | 10/2002 | Adae-Amoakoh et al. .. 257/778 |

* cited by examiner

HYPERBGA BUILDUP LAMINATE

BACKGROUND OF THE INVENTION

1. Technical Field

The present invention relates to a method and structure for forming a redistribution structure on a circuitized substrate.

2. Related Art

Wireability within an electronic structure comprising a multilayered laminate is limited by physical dimensions of the multilayered laminate and physical structure within the multilayered laminate (e.g., through holes, blind vias, etc.). Accordingly, there is a need to increase wireability within an electronic structure comprising a multilayered laminate.

SUMMARY OF THE INVENTION

The present invention provides an electronic structure, comprising:

an internally circuitized substrate having a metallic plane on a first surface of the substrate; and a redistribution structure having N dielectric layers denoted as dielectric layers 1, 2, ..., N, N metal planes denoted as metal planes 1, 2, ..., N, and a microvia structure through the N dielectric layers, wherein N is at least 2, wherein dielectric layer 1 is on the first surface of the substrate and on the metallic plane, wherein metal plane J is on dielectric layer J for J=1, 2, ..., N, wherein dielectric layer I is on dielectric layer I-1 and on metal plane I-1 for I=2, ..., N, and wherein the microvia structure electrically couples metal plane N to the metallic plane. metallic plane.

The present invention provides a method for forming an electronic structure, comprising:

providing an internally circuitized substrate having a metallic plane on a first surface of the substrate; and forming a redistribution structure including forming N dielectric layers denoted as dielectric layers 1, 2, ..., N, forming N metal planes denoted as metal planes 1, 2, ..., N, and forming a microvia structure through the N dielectric layers such that the microvia structure electrically couples metal plane N to the metallic plane, wherein N is at least 2, and wherein forming the N dielectric layers and the N metal planes includes setting a dummy index J=0 and looping over J as follows:

adding 1 to J;

if J=1 then forming dielectric layer 1 on the first surface of the substrate and on the metallic plane, else forming dielectric layer J on dielectric layer J-1 and on metal plane J-1;

forming metal plane J on dielectric layer J; and if J<N then returning to adding 1 to J and continuing the looping, else ending the looping.

DETAILED DESCRIPTION OF THE INVENTION

Figure 1:
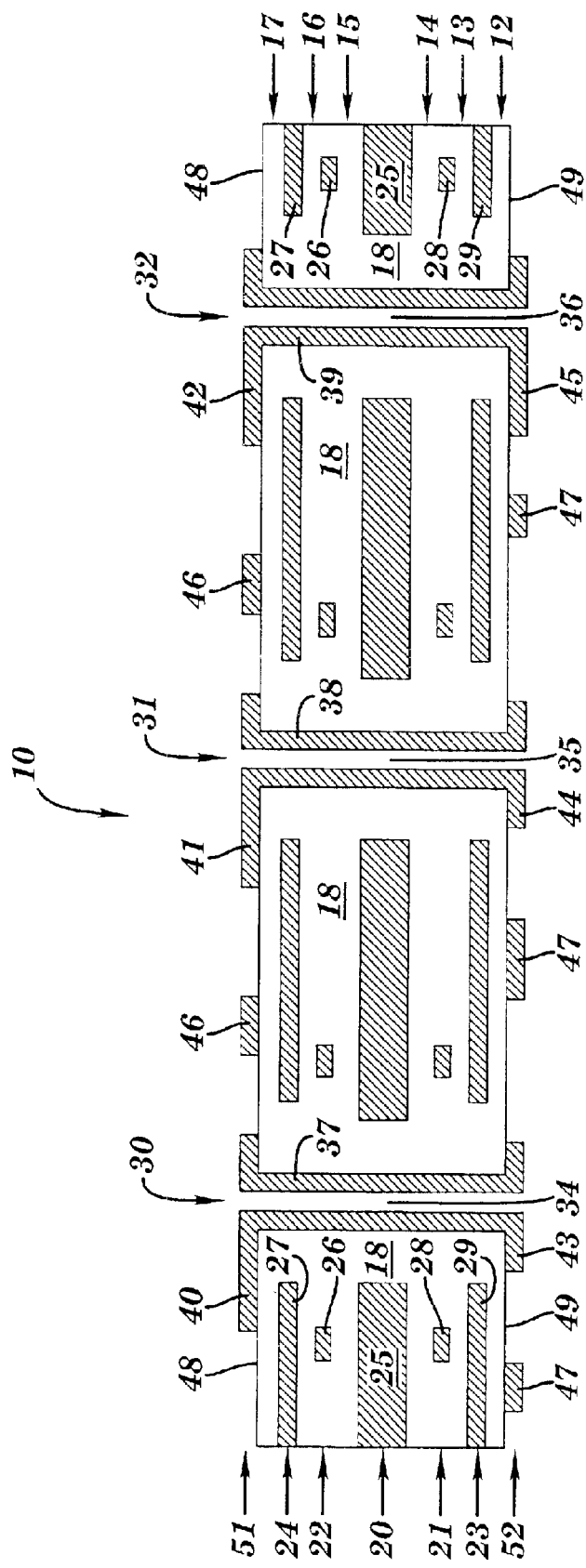
FIG. 1 depicts a front cross-sectional view of a substrate that includes a multilayered laminate, in accordance with embodiments of the present invention.

FIG. 1 illustrates a front cross-sectional view of a substrate 10, in accordance with embodiments of the present invention. The substrate 10 includes a multilayer laminate as shown, including dielectric layers 12–17, a ground plane 20 between dielectric layers 14 and 15, a signal plane 22 between dielectric layers 15 and 16, a power plane 24 between dielectric layers 16 and 17, a signal plane 21 between dielectric layers 13 and 14, and a power plane 23 between dielectric layers 12 and 13. The substrate 10 also includes plated through holes (PTHs) 30–32 having through holes 34–36 and metallic plating (e.g, copper plating) 37–39, respectively.

Electrically conductive pads (e.g., copper pads) 40–42 on a top surface 48 of the substrate 10 are integral with (and thus electrically coupled with) the metallic platings 37–39 of the PTHs 30–32, respectively. Electrically conductive pads (e.g., copper pads) 43–45 on a bottom surface 49 of the substrate 10 are integral with (and thus electrically coupled with) metallic platings 37–39 of the PTHs 30–32, respectively. A signal plane 51 having electrically conductive regions 46 comprising an electrically conductive metal such as, inter alia, copper is on the top surface 48 of the substrate 10. A signal plane 52 having electrically conductive regions 47 comprising an electrically conductive metal such as, inter alia, copper is on the bottom surface 49 of the substrate 10. The electrically conductive regions 46 and 47 may include, inter alia, electrically conductive lines or electrically conductive pads.

The dielectric layers 12–17 each include a dielectric material 18 such as a polytetrafluoroethylene (PTFE) material filled with silicon particles, or other dielectric materials as are known in the art for use with multilayer chip carriers (e.g., such epoxy resins, polyimide, polyphenylene ethers, etc.). The ground plane 20 includes a conductive metal such as, inter alia, a copper-INVAR®-copper (CIC) layered structure, at a common voltage level. The signal planes 21 and 22 each include conductive lines 26 and 28, respectively, comprising an electrically conductive metal such as, inter alia, copper. The power planes 23 and 24 each include electrically conductive metal (e.g., copper) at a common voltage level that differs from, and is higher than, the common voltage level of the ground planes 20. The power planes 23 and 24 include more metal and are stiffer than the signal planes 21 and 22 and, accordingly, help to protect the signal planes 21 and 22 from being damaged by thermally induced stresses such as during thermal cycling or during any other thermal transient operation.

The substrate 10 in FIG. 1 may be formed by first laminating dielectric layers 14 and 15 to opposite surfaces of the power plane 20, followed by forming the signal planes 21 and 22 on the dielectric layers 14 and 15, respectively. Dielectric layers 13 and 16 are formed on the signal planes 21 and 22, respectively. Power planes 23 and 24 are formed on the dielectric layers 13 and 16, respectively. Dielectric layers 12 and 17 are formed on the power planes 23 and 24, respectively. At this stage of the formation of the substrate 10, the dielectric material 18 is continuously distributed within the substrate 10.

Next, through holes 34–36 are formed through the substrate 10 by any method known to one of ordinary skill in the art such as by, inter alia, laser drilling. Debris is cleaned from surfaces of the holes using known cleaning techniques. The through holes 34–36, the top surface 48, and the bottom surface 49, are plated with an electrically conductive metal (e.g., copper) by any method known to one of ordinary skill in the art (e.g., electroless plating of copper followed by acid electroplating of copper), resulting in formation of platings 37–39 on walls of the through holes 34–36, respectively. The conductive pads 40–42 and the conductive regions 46 are formed by applying selective etching techniques with photolithography (or using other applicable techniques known to one of ordinary skill in the art) to the plating or foil (e.g., copper plating or copper foil) on the top surface 48. Similarly, the conductive pads 43–45 and the conductive regions 47 are formed by applying selective etching techniques with photolithography (or using other applicable techniques known to one of ordinary skill in the art) to the plating or foil (e.g., copper plating or copper foil) on the bottom surface 49. The resultant conductive metal of the signal planes 51 and 52 may comprise chlorited copper (i.e., copper that has been treated with chlorite to produce a roughened surface) for enhancing an adhesion strength of redistribution layers which will be subsequently formed on the signal planes 51 and 52 (as discussed infra in conjunction with FIGS. 2 and 3).

In FIG. 1, the number and distribution of ground planes, signal planes, power planes, and PTHs comprised by the substrate 10 is merely illustrative. It is within the scope of the present invention for the substrate 10 to include any number and distribution of ground planes, signal planes, power planes, and PTHs, as required in any given application and as compatible with dimensions of the substrate 10. Also, a PTH may be replaced by a plated buried via or a plated blind. In addition, the signal planes 51 and 52 on the top surface 48 and bottom surface and 49, respectively, may each be replaced by any surface distribution of conductive metal such as, inter alia, a power plane or a ground plane.

Definitionally, the substrate 10 includes all structure shown in FIG. 1. Also definitionally, the top surfaces 48 and 49 of the substrate 10 include the exposed surfaces of the dielectric layers 12 and 17, respectively, but do not include exposed surfaces of the conductive pads 40–42, the conductive pads 43–45, and the conductive regions 46–47.

Figure 2:
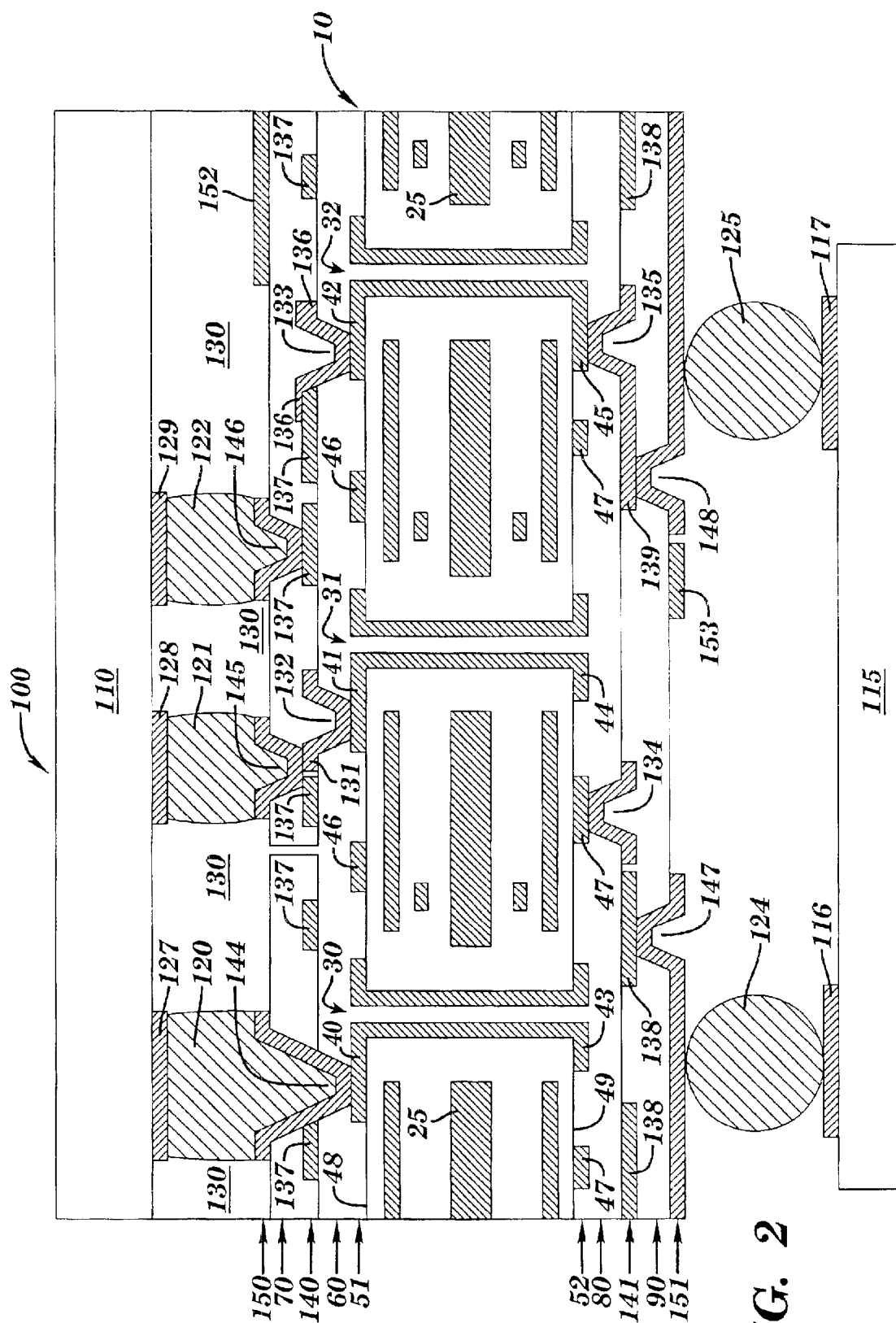
FIG. 2 depicts FIG. 1 after two redistribution layers have been added to both top and bottom surfaces of the substrate.

FIG. 2 illustrates FIG. 1 after a two-layer redistribution structure has been added to both the top surface 48 and the bottom surface 49 of the substrate 10, in accordance with embodiments of the present invention. In particular, FIG. 2 illustrates an electronic structure 100, comprising: the substrate 10, a redistribution layer 60 on the top surface 48 of the substrate 10, a redistribution layer 70 on the redistribution layer 60, a redistribution layer 80 on the bottom surface 49 of the substrate 10, and a redistribution layer 90 on the redistribution layer 80.

The electronic structure 100 also includes an electronic device (e.g., a semiconductor chip) 110 coupled to the redistribution layer 70 by solder members 120–122 (e.g., Controlled Collapse Chip Connection, or "C4", solder balls), wherein conductive pads 127–129 conductively interface the solder members 120–122 to the electronic device 110. Additionally, the electronic structure 100 includes an electronic card or board (e.g., circuit card) 115 solderably coupled to the redistribution layer 90 by solder members 124 and 125 (e.g., ball grid array, or "BGA", solder balls), wherein conductive pads 116 and 117 conductively interface the solder members 124 and 125 to the electronic card or board 115. An underfill material (e.g., an organic resin or any underfill material known in the art) 130 encapsulates the solder members 120–122 and fills a space between the electronic device 110 and the redistribution layer 70. The underfill material 130 mitigates adverse effects on the structural integrity of the solder members 120–122 caused (during thermal cycling or other thermal transients) by a mismatch in coefficient of thermal expansion (CTE) between the electronic device 110 and the electronic card or board 115, and/or between the electronic device 110 and the solder members 120–122.

The electronic structure 100 is formed as follows. Starting with the substrate 10 of FIG. 1, redistribution layers 60 and 80 are laminated over the top surface 48 and the bottom surface 49 of the substrate 10, respectively, covering the conductive pads 40–42 and the conductive pads 43–45, respectively, as well as the conductive regions 46 and 47, respectively. Material of redistribution layers 60 and 80 also fill the PTHs 30–32. The redistribution layers 60 and 80 each include a dielectric material, such as DYNAVIA 2000™ (Shipley Ronal), polyimide, PSR-4000™ (from Taiyo Ink Co. Ltd.), VIALUX® (E. I. du Pont de Nemours and Company), and other similar materials made by Arlon, Asahi Chemical, and other similar companies. Such material must be capable of being reliably plated with conductive material such as copper after being laser drilled. For said plating on such material to be formable, and reliable during thermal cycling and circuit card-attach operations, such material is should, for embodiments described herein, be laser drillable, be copper platable, have a high thermal resistance or equivalently have a high glass transition temperature (e.g., above about 150° C.), and have a low CTE (e.g., less than about 50 ppm/° C.). Additionally, such material should have a high stiffness (e.g., at least about 700,000 psi) in order to protect conductive lines of signal planes on redistribution layers, as will be discussed infra.

After the redistribution layers 60 and 80 are formed, microvias 132 and 133 are formed in the redistribution layer 60 on the conductive pads 41 and 42, respectively, and microvias 134 and 135 are formed in the redistribution layer 80 on the conductive region 47 and the conductive pad 45, respectively. The microvias 132–135, which are blind vias, are formed by any method known to one of ordinary skill in the art, such by, inter alia, laser drilling of holes, followed by cleaning debris from surfaces of the holes using known cleaning techniques, and plating an electrically conductive metal on the surfaces of the holes as known in the art (e.g., electroless plating of copper followed by acid electroplating of copper). The microvias 132 and 133 are electrically coupled to the PTHs 31 and 32, respectively, and may therefore communicate electrically with internal layers of the substrate 10 as well as with the redistribution layer 80. Since the microvia 135 is likewise electrically coupled to the PTH 32, the microvias 133 and 135 are thus electrically coupled to each other. The microvia 134 is electrically coupled to the conductive region 47 of signal plane 52, and is thus electrically coupled to any conductive structure in the signal plane 52 that the conductive region 47 is electrically coupled to. Exterior portions of the conductive platings on the microvias 132–133 extend outside of the microvias 132–133 and on exposed surfaces of the redistribution layers 60 and 80, respectively. Such exterior portions of the conductive platings on the microvias 132–133 may thus serve as electrically conductive pads or conductive wiring to which other conductive structure may be coupled. For example, such an exterior portion 131 of the conductive plating on the microvia 132 serves as a conductive region or conductive pad to which a conductively plated bottom portion of a microvia 145 is electrically coupled. Formation of the microvia 145 will be described infra.

Metal planes 140 and 141 are formed on the redistribution layers 60 and 80, respectively. The metal plane 140 includes conductive regions 137 and the conductive regions or pads 131 and 136. The metal plane 141 includes conductive regions 138 and the conductive region or pad 139. Generally, a "metal plane" is planar distribution of conductive metal at a level (i.e., at a distance from the top surface 48 or the bottom surface 49 of the substrate 10), wherein "planar"

does not relate to a mathematical plane but rather to a plane of small but finite thickness. A metal plane may include, inter alia, a signal plane, a power plane, a ground plane, etc, as well as conductive pads or region which are integral with a microvia. A metal plane may be alternatively referred to as a "metallic plane."

Figure 3:
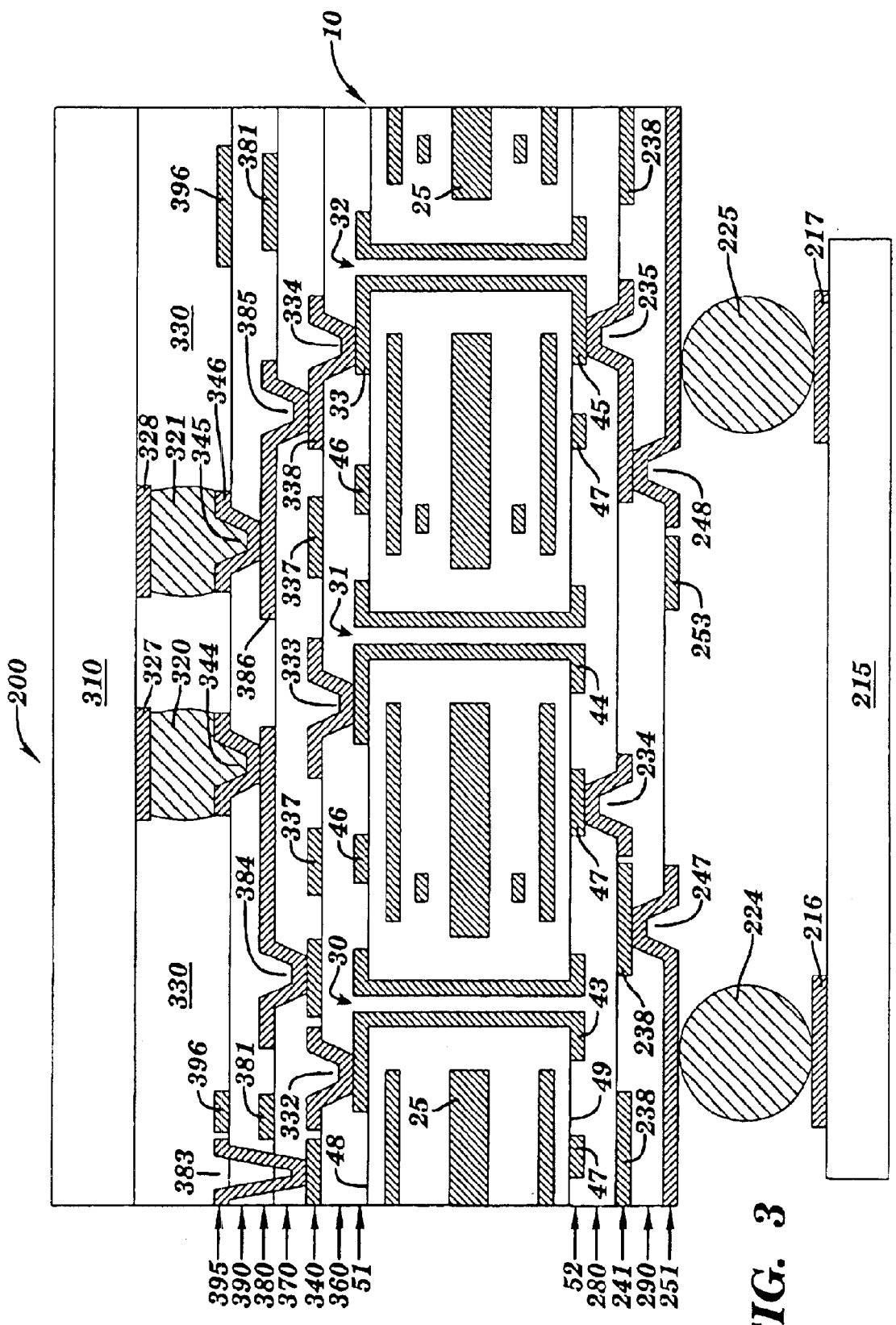
FIG. 3 depicts FIG. 1 after three redistribution layers have been added to a top surface of the substrate and after two redistribution layers have been added to a bottom surface of the substrate.

Redistribution layer 70 is laminated over the redistribution layer 60 and over the metal plane 140, and redistribution layer 90 is laminated over the redistribution layer 80 and over the metal plane 141. Dielectric material of redistribution layer 70 fills the microvias 132 and 133, and dielectric material of redistribution layer 90 fills the microvias 134 and 135. The dielectric material of redistribution layers 70 and 90 of FIG. 3 is of the same type as the dielectric material of the redistribution layers 60 and 80.

Microvia 145 is formed in the redistribution layer 70 on conductive region 137 and conductive plating 131, and microvia 146 is formed in the redistribution layer 70 on conductive region 137. Microvias 147 and 148 are similarly formed in the redistribution layer 90. Additionally, microvia 144 is formed straight through the redistribution layers 70 and 60, and is thus directly coupled electrically to the PTH 30. The redistribution layers 70 and 90 are formed, and comprise material, as described supra in conjunction with the redistribution layers 60 and 80.

Metal planes 150 and 151 are formed on the redistribution layers 70 and 90, respectively. The metallic planes 150 and 151 include conductive regions 152 and 153, respectively, such as, inter alia, signal planes, power planes, ground planes, etc, as conductive pads and regions located at the level of the metallic planes 150 and 151.

The solder members 120–122 electrically couple the electronic device 110 to the microvias 144–146, respectively. The solder members 124–125 electrically couple the electronic card or board 115 to the microvias 147–148, respectively. The solder members 120–122 are depicted in FIG. 2 as being prior to solder reflow attachment to the metal plating on the microvias 144–146, respectively.

FIG. 3 illustrates FIG. 1 after a three-layer redistribution structure has been added to the top surface 48 of the substrate 10 and after a two-layer redistribution structure has been added to the bottom surface 49 of the substrate 10, in accordance with embodiments of the present invention. In particular, FIG. 3 illustrates an electronic structure 200, comprising: the substrate 10, redistribution layer 360 on the top surface 48 of the substrate 10, a redistribution layer 370 on the redistribution layer 360, a redistribution layer 390 on the redistribution layer 370, a redistribution layer 280 on the bottom surface 49 of the substrate 10, and a redistribution layer 290 on the redistribution layer 280. The electronic structure 200 also includes a metal plane 340 (including electrically conductive regions 337) on the redistribution layer 360, a metal plane 380 (including electrically conductive regions 381) on the redistribution layer 370, a metal plane 395 (including electrically conductive regions 396) on the redistribution layer 390, a metal plane 241 (including electrically conductive regions 238) on the redistribution layer 280, and a metal plane 251 (including electrically conductive regions 253) on the redistribution layer 290. Microvias 332–334 go through the redistribution layer 360, microvias 384–385 go through the redistribution layer 370, microvias 344–345 go through the redistribution layer 390, microvias 234–235 go through the redistribution layer 280, and microvias 247–248 go through the redistribution layer 290. Dielectric material of redistribution layer 370 fills the microvias 332–334, dielectric material of redistribution layer 390 fills the microvias 384 and 385, and dielectric material of redistribution layer 290 fills the microvias 234 and 235. The dielectric material of redistribution layers 360, 370, 390, 280, and 290 of FIG. 3 is of the same type as the dielectric material of the redistribution layers 60 and 80 of FIG. 2.

The electronic structure 200 further includes an electronic device 310 with attached conductive pads 327 and 328 to which solder members 320–321 (e.g., C4 solder balls) are coupled, respectively. An underfill material (e.g., an organic resin or any underfill material known in the art) 330 encapsulates the solder members 320–321 and fills a space between the electronic device 310 and the redistribution layer 390. The underfill material 330 mitigates adverse effects on the structural integrity of the solder members 320–321 caused (during thermal cycling or other thermal transients) by a mismatch in the CTE between the electronic device 310 and an electronic card or board 215, and/or between the electronic device 310 and the solder members 320–321. The solder members 320–321 are also coupled the microvias 344 and 345, respectively. The electronic structure 200 additionally includes the electronic card or board (e.g., circuit card) 215 with attached conductive pads 216 and 217 to which solder members 224–225 (e.g., BGA solder balls) are coupled, respectively. The solder members 224–225 are also coupled the microvias 247 and 248, respectively.

In the electronic structure 200 of FIG. 3, the redistribution layers, metal planes, microvias, and associated electrically conductive couplings and electrically conductive paths have the same or analogous characteristics, properties, features, and advantages, as do the redistribution layers, metal planes, and microvias, and associated electrically conductive couplings and electrically conductive paths in the electronic structure 100 of FIG. 2.

While FIG. 2 depicts a same number (i.e., two) of redistribution layers on the top surface 48 and the bottom surface 49 of the substrate 10, in general the number of redistribution layers on the top surface 48 and the bottom surface 49 may be different. For example, FIG. 3 shows three redistribution layers (360, 370, and 390) on the top surface 48, and two redistribution layers (260 and 290) on the bottom surface 49. Generally, the present invention includes N redistribution layers on (i.e., over) the top surface 48 and P redistribution layers on the bottom surface 49, wherein at least one of N and P is two or greater, and wherein the other of N and P is zero or a positive integer. The special case of N=P increases symmetry with respect to the ground plane 25 of the substrate 10, particularly if approximately uniform metal content is symmetrically distributed in the various metal planes with respect to the ground plane 25. The aforementioned symmetry of the N=P case has the advantage of making it easier to accommodate thermal stresses that occur during thermal cycling, which reduces or eliminates warping of the substrate 10 and the electronic device 110 of FIG. 2 or 310 of FIG. 3.

FIG. 2 illustrates advantages of the multiple redistribution layers (e.g., the redistribution layers 60, 70, 80, and 90) on the top surface 48 and on the bottom surface 49 of the substrate 10. The redistribution layers serve as buildup layers which provides a capability of adding extra wiring layers; e.g., the metal planes 140–141 and 150–151. The extra wiring level, coupled with the microvias (e.g, the microvias 132–135 and 144–148) in the multiple redistribution layers, provide extra wireout capability for making more efficient use of space and increasing overall wiring density. In addition, there is increased flexibility in how electrically conductive structure may be distributed inasmuch as a metal plane on each redistribution layer may be any metal distribution, included a signal plane, a power plane, or a ground plane. With the multiple redistribution layers, any metal or metallic plane on a redistribution layer on the top surface 48 of the substrate 10 may be electrically coupled to any metal or metallic plane on a redistribution layer on the bottom surface 49 of the substrate 10 or to any internal layer of the substrate 10, in light of the electrically conductive paths facilitated by the microvias in the redistribution layers 60, 70, 80, and 90 and the PTHs in the substrate 10. FIG. 2 illustrates several of such electrically conductive paths. For example, the metal plane 140 is electrically coupled to the metal plane 151 through the path of the conductive region 137, the microvia 133, the conductive pad 42, the PTH 32, the conductive pad 45, the microvia 135, and the microvia 148. As another example, the electronic device 110 is coupled to the conductive pad 44 of the PTH 31 by a path that includes the conductive pad 128, the solder member 121, the microvia 145, the conductive pad 131, the microvia 132, the conductive pad 41, the PTH 31, and the conductive pad 44. The electronic device 110 may be coupled to wiring in the redistribution layer 70 through the solder member 122 and the microvia 146, or to wiring in the redistribution layer 60 through the solder member 120 and the microvia 144 or through the solder member 121 and the microvias 145 and 132. The number and types of conductive paths facilitated by the multiple redistribution layers of the present invention are virtually unlimited. FIG. 3 also includes the aforementioned features and advantages.

The microvia 144 in FIG. 2 is particularly desirable because it provides an efficient conductive path through more than one redistribution layer. For N redistribution layers on the top surface 48 of the substrate 10, a microvia may go through any M consecutive layers (1<M<N) starting with the layer that is furthest from the top surface 48.

The multiple redistribution layers of the present invention have an advantage in high frequency applications (i.e., above 1 gigabit such as radio frequency applications) in which it is desirable to maximize the linear dimension of dielectric material between a solder member (i.e., any of the solder members 120–122 or 124–125) and the nearest power plane in the electronic structure 100 of FIG. 2, or between a solder member (i.e., any of the solder members 320–321) and the nearest power plane in the electronic structure 200 of FIG. 3. With use of multiple redistribution layers of dielectric material, said linear dimension in relation to the nearest power plane can be more easily controlled.

If signal planes are formed within a multiple redistribution layer structure, such signal lines are protected from thermal stresses by the stiff material within the multiple redistribution layers. This enables more signal planes (and thus more wiring levels) to be added while still retaining a low-stress substrate 10 dielectric material such as PTFE which is soft and compliant. As stated supra, signal planes within the substrate 10 require protection by power planes in the substrate 10. Signal planes on redistribution layers, however, do not require protection of such power planes because of the stiffness of the material in the redistribution layers. Thus, the multiple redistribution layers allow improved wireability by allowing addition of signal planes on the redistribution layers, without sacraficing reliability as to thermal stress susceptibility. The multiple redistribution layer structure also makes it feasible to transfer signal planes and/or power planes from the substrate 10 to metal planes of the multiple redistribution layer structure.

As illustrated for the embodiments of FIGS. 2 and 3, the multiple redistribution structure on either the top surface 48 or the bottom surface 49 of the substrate 10 has N dielectric layers (denoted as dielectric layers 1, 2, . . . , N), N metal planes (denoted as metal planes 1, 2, . . . , N), and a microvia structure, wherein N≧2. Dielectric layer 1 (i.e., redistribution layer 60 or 80) is on the top surface 48 or the bottom surface 49 of the substrate 10 and thus also on a metallic plane; i.e., on the metal plane 51 or the metal plane 52, respectively. Thus, the metals planes 51 and 52 are each called a "metallic plane" for purposes of the notation being discussed herein. Metal plane 1 (i.e., metal plane 140 or 141) is on dielectric layer 1, dielectric layer 2 (i.e., redistribution layer 70 or 90) is on dielectric layer 1 and metal plane 1, metal plane 2 (i.e., metal plane 150 or 151) is on dielectric layer 2, . . . , dielectric layer N is on dielectric layer N-1 and metal plane N-1, and metal plane N is on dielectric layer N. The microvia structure electrically couples the metal plane N to the metallic plane (i.e., the metal plane 51 or the metal plane 52) by a collection of microvias coupled with intervening metal planes. The microvia structure includes a microvia or a portion of a microvia through each of the N dielectric layers. Many such combinations of microvias are possible. An example microvia combination is N microvias (i.e., a microvia in each dielectric layer) such that microvia J is electrically coupled to microvia J-1 by metal plane J-1 for J=2, 3, . . . , N. To illustrate, FIG. 3 has N=3 and shows: microvia 345 electrically coupled to microvia 385 by metal plane 380 (specifically, conductive pad 386 in metal plane 380), microvia 385 electrically coupled to microvia 334 by metal plane 340 (specifically, conductive pad 338 in metal plane 340), and microvia 334 electrically coupled to metal plane 51 by conductive pad 33, which electrically couples the metal plane 395 to the metal plane 51 in light of the fact that conductive pad 346 of metal plane 395 is integral with, and thus electrically connected with, the conductive plating of the microvia 346. Another microvia combination includes a microvia that passes through two or more dielectric layers (e.g., the microvia 144 of FIG. 2). For example and although not shown explicitly in FIG. 3, a microvia could pass through redistribution layers 360, 370, and 390. In FIG. 3, microvia 383 passes through redistribution layers 370 and 390, just as microvia 144 of FIG. 2 passes through redistribution layers 60 and 70. Thus in FIG. 3, microvia 383 passing through redistribution layers 370 and 390 could be electrically coupled by metal plane 340 to a microvia (e.g., the microvia 332, 333, or 334) in redistribution layer 360.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure, comprising:
an internally circuitized substrate having a metallic plane on a first surface of the substrate; and
a redistribution structure having N dielectric layers denoted as dielectric layers 1, 2, . . . , N, N metal planes denoted as metal planes 1, 2, . . . , N, and a microvia structure through the N dielectric layers, wherein N is at least 2, wherein dielectric layer 1 is on the first surface of the substrate and on the metallic plane, wherein metal plane J is on dielectric layer J for J=1, 2, . . . , N, wherein dielectric layer I is on dielectric layer I-1 and on metal plane I-1 for I=2, . . . , N, and wherein the microvia structure electrically couples metal plane N to the metallic plane, wherein the microvia structure includes at least one microvia, and wherein each microvia of the at least one microvia is a blind via having an outer wall surface and an end surface with an electrically conductive plating on the outer wall surface and on the end surface such that the electrically conductive plating includes a continuous distribution of electrically conductive material on the outer wall surface along an entire perimeter of the blind via, wherein the N dielectric layers each include a dielectric material having a stiffness of at least about 700,000 psi.

2. The electronic structure of claim 1, wherein the at least one microvia includes N microvias denoted as microvias 1, 2, . . . , N, wherein the microvia K passes through dielectric layer K for K=1, 2, . . . , N, wherein metal plane N is electrically coupled to microvia N, wherein metal plane J-1 electrically couples microvia J to microvia J-1 for J=2, 3, . . . , N, and wherein microvia 1 is electrically coupled to the metallic plane.

3. The electronic structure of claim 1, wherein the at least one microvia includes a microvia that passes through the N dielectric layers, wherein the microvia electrically couples metal plane N to the metallic plane.

4. The electronic structure of claim 1, wherein N=2 or N=3.

5. The electronic structure of claim 1, wherein the dielectric material has a glass transition temperature of at least about 150° C.

6. The electronic structure of claim 1, wherein dielectric material has a coefficient of thermal expansion of no more than about 50 ppm/° C.

7. The electronic structure of claim 1, wherein at least one of the metallic plane and the N metal planes includes a signal plane.

8. The electronic structure of claim 1, wherein at least one of the N metal planes includes a power plane.

9. The electronic structure of claim 1, wherein at least one of the N metal planes includes a ground plane.

10. The electronic structure of claim 1, wherein the substrate includes a first dielectric material comprising a polytetrafluoroetheylene (PTFE) having silicon particles therein.

11. The electronic structure of claim 10, wherein the substrate further includes a ground plane, a power plane, and a signal plane, wherein the ground plane, the power plane, and the signal plane are each embedded within the first dielectric material, and wherein the signal plane is disposed between the ground plane and the power plane.

12. The electronic structure of claim 10, wherein the substrate further includes a ground plane, first and second power planes, and first and second signal planes, wherein the ground plane, the first and second power planes, and the first and second signal planes are each embedded within the first dielectric material, wherein the first signal plane is disposed between the ground plane and the first power plane, and wherein the second signal plane is disposed between the ground plane and the second power plane.

13. The electronic structure of claim 1, further comprising an electronic device electrically coupled to the metal plane N by solder members.

14. The electronic structure of claim 13, wherein the electronic device includes a semiconductor chip.

15. The electronic structure of claim 14, further comprising a chip carrier that includes the internally circuitized substrate.

16. The electronic structure of claim 15, wherein the solder members comprise controlled collapse chip connection (C4) solder balls.

17. The electronic structure of claim 13, wherein the electronic structure includes at least one power plane, and wherein a thickness of the redistribution structure is large enough that a nearest distance between the solder member and any power plane of the at least one power plane is not less than a predetermined minimum distance value.

18. The electronic structure of claim 17, wherein the predetermined minimum distance value is predetermined by requirements of a given radio frequency application.

19. The electronic structure of claim 1, wherein a plated through hole (PTH) passes through the substrate from the first surface to a second surface of the substrate, and wherein the metallic plane is electrically coupled to the PTH.

20. The electronic structure of claim 19, further comprising a second metallic plane on the second surface of the substrate and a second redistribution structure having P second dielectric layers denoted as second dielectric layers 1, 2, . . . , P, P second metal planes denoted as second metal planes 1, 2, . . . , P, and a second microvia structure through the P second dielectric layers, wherein P is at least 1, wherein second dielectric layer 1 is on the second surface of the substrate and on the second metallic plane, wherein second metal plane J is on second dielectric layer J for J=1, 2, . . . , P, wherein if I>1 then second dielectric layer I is on second dielectric layer I-1 and on second metal plane I-1 for I=2, . . . , P, wherein the second microvia structure electrically couples the second metal plane P to the second metallic plane, wherein the second metallic plane is electrically coupled to the PTH, wherein the second microvia structure includes one or more microvias, and wherein each microvia of the one or more microvias is a blind via having an outer wall surface and an end surface with an electrically conductive plating on the outer wall surface and on the end surface such that the electrically conductive plating includes a continuous distribution of electrically conductive material on the outer wall surface along an entire perimeter of the blind via.

21. The electronic structure of claim 20, wherein P=N.

22. The electronic structure of claim 20, further comprising an electronic board electrically coupled to the second metal plane N by solder members.

23. The electronic structure of claim 22, wherein the electronic board includes a circuit card.

24. The electronic structure of claim 23, wherein the solder members comprise ball grid array (BGA) solder balls.

25. The electronic structure of claim 1, wherein the electrically conductive plating on the outer surface of each blind via of the at least one microvia is a metal plating.

26. The electronic structure of claim 25, wherein the electrically conductive material is copper.

27. The electronic structure of claim 1, wherein a microvia of the at least one microvia includes the dielectric material.

28. An electronic structure, comprising:
an internally circuitized substrate having a metallic plane on a first surface of the substrate; and
a redistribution structure having N dielectric layers denoted as dielectric layers 1, 2, . . . , N, N metal planes denoted as metal planes 1, 2, . . . , N, and a microvia structure through the N dielectric layers, wherein N is at least 2, wherein dielectric layer 1 is on the first surface of the substrate and on the metallic plane, wherein metal plane J is on dielectric layer J for J=1, 2, . . . , N, wherein dielectric layer I is on dielectric layer I-1 and on metal plane I-1 for I=2, . . . , N, and wherein the microvia structure electrically couples metal plane N to the metallic plane, wherein the microvia structure includes at least one microvia, and wherein each microvia of the at least one microvia is a blind via having an outer wall surface and an end surface with an electrically conductive plating on the outer wall surface and on the end surface such that the electrically conductive plating includes a continuous distribution of electrically conductive material on the outer wall surface along an entire perimeter of the blind via, wherein the at least one microvia includes a first microvia, wherein the first micro via passes through dielectric layers M through N, wherein M is at least 2, wherein N is at least 3, wherein M is less than N, and wherein metal plane N is electrically coupled to the first microvia, wherein the at least one microvia further includes a second microvia that passes through dielectric layers 1 through M-1, wherein metal plane M-1 electrically couples the first microvia to the second microvia, and wherein the second microvia is electrically coupled to the metallic plane.

29. The electronic structure of claim 28, wherein the at least one microvia further includes M-1 third microvias denoted as third microvias 1, 2, . . . , M-1, and wherein the third microvia K passes through dielectric layer K for K=1, 2, . . . , M-1, wherein the metal plane M-1 electrically couples the first microvia to third microvia M-1, wherein if M>2 then metal plane J-1 electrically couples third microvia J to third microvia J-1 for J=2, 3, . . . , M-1, and wherein third microvia 1 is electrically coupled to the metallic plane.

30. The electronic structure of claim 28, further comprising a semiconductor chip electrically coupled to the metal plane N by solder members, wherein a portion of a first solder member of the solder members is within the first microvia and is electrically coupled to the first microvia.

31. The electronic structure of claim 30, wherein the first solder member is a controlled collapse chip connection (C4) solder ball.

32. The electronic structure of claim 31, wherein the N dielectric layers each include a dielectric material having a stiffness of at least about 700,000 psi.

33. The electronic structure of claim 32, wherein a microvia of the at least one microvia includes the dielectric material.

34. The electronic structure of claim 28, wherein the N dielectric layers each include a dielectric material having a stiffness of at least about 700,000 psi.

35. The electronic structure of claim 34, wherein a microvia of the at least one microvia includes the dielectric material.

* * * * *